United States Patent
Goda

(10) Patent No.: US 7,768,835 B2
(45) Date of Patent: Aug. 3, 2010

(54) NON-VOLATILE MEMORY ERASE VERIFY

(75) Inventor: Akira Goda, Boise, ID (US)

(73) Assignee: Micron Technology, Inc., Boise, ID (US)

(*) Notice: Subject to any disclaimer, the term of this patent is extended or adjusted under 35 U.S.C. 154(b) by 394 days.

(21) Appl. No.: 11/502,317

(22) Filed: Aug. 9, 2006

(65) Prior Publication Data

US 2008/0037307 A1   Feb. 14, 2008

(51) Int. Cl.
*G11C 16/06* (2006.01)

(52) U.S. Cl. ............... 365/185.22; 365/185.29; 365/185.33; 365/185.18; 365/185.27

(58) Field of Classification Search ............ 365/185.29, 365/185.33, 185.18, 185.22, 185.27
See application file for complete search history.

(56) References Cited

U.S. PATENT DOCUMENTS

| | | | | |
|---|---|---|---|---|
| 5,321,699 A | * | 6/1994 | Endoh et al. ............ | 365/185.17 |
| 5,675,540 A | | 10/1997 | Roohparvar | |
| 5,978,276 A | * | 11/1999 | Wong ..................... | 365/185.29 |
| 6,009,014 A | * | 12/1999 | Hollmer et al. ......... | 365/185.22 |
| 6,229,736 B1 | * | 5/2001 | Song ..................... | 365/185.29 |
| 6,272,051 B1 | * | 8/2001 | Choi ..................... | 365/185.29 |
| 6,452,836 B1 | | 9/2002 | Roohparvar | |
| 6,501,681 B1 | * | 12/2002 | Van Buskirk et al. ... | 365/185.22 |
| 6,563,741 B2 | | 5/2003 | Mihnea et al. | |
| 6,598,113 B2 | | 7/2003 | Roohparvar | |
| 6,614,691 B2 | | 9/2003 | Roohparvar | |
| 6,798,699 B2 | | 9/2004 | Mihnea et al. | |
| 6,882,592 B2 | | 4/2005 | Noguchi et al. | |
| 6,883,044 B1 | | 4/2005 | Roohparvar | |
| 6,894,931 B2 | | 5/2005 | Yaegashi et al. | |
| 7,095,085 B2 | | 8/2006 | Goda et al. | |
| 7,117,402 B2 | | 10/2006 | Di Zenzo et al. | |
| 2002/0008996 A1 | * | 1/2002 | Hirano .................. | 365/185.33 |
| 2003/0039145 A1 | | 2/2003 | Keays | |
| 2004/0264264 A1 | | 12/2004 | Yaegashi | |
| 2005/0024974 A1 | | 2/2005 | Noguchi et al. | |
| 2005/0157578 A1 | | 7/2005 | Noguchi et al. | |
| 2005/0204212 A1 | | 9/2005 | Noguchi et al. | |
| 2007/0237003 A1 | * | 10/2007 | Melik-Martirosian et al. .... | 365/185.28 |

OTHER PUBLICATIONS

Imamiya, Kenichi, "TA 7.6: A 35ns-CycleTime 3.3V-Only 32Mb NAND Flash EEPROM", *Semiconductor Engineering Lab, Toshiba Corporation: ISSC95 / Session 7 / Flash Memory / Paper TA 7.6*, (1995),pp. 130, 131, 351.

Seki, "An 80-ns 1-Mb Flash Memory with On-Chip Erase / Erase-Verify Controller", *IEEE Journal of Solid-State Circuits, vol. 25, No. 5*, (Oct. 1990),1147-1152.

* cited by examiner

*Primary Examiner*—Richard Elms
*Assistant Examiner*—Eric Wendler
(74) *Attorney, Agent, or Firm*—Schwegman, Lundberg & Woessner, P.A.

(57) ABSTRACT

A memory device having memory cells fabricated in a substrate well is described. The memory device includes control circuitry to perform an erase operation on the memory cells and a voltage bias circuit to bias the substrate well to a positive voltage level during an erase verification operation of memory cells. The voltage bias circuit controls a discharge level of the substrate well following the erase operation to prevent the substrate well from fully discharging lower than the positive voltage level.

34 Claims, 8 Drawing Sheets

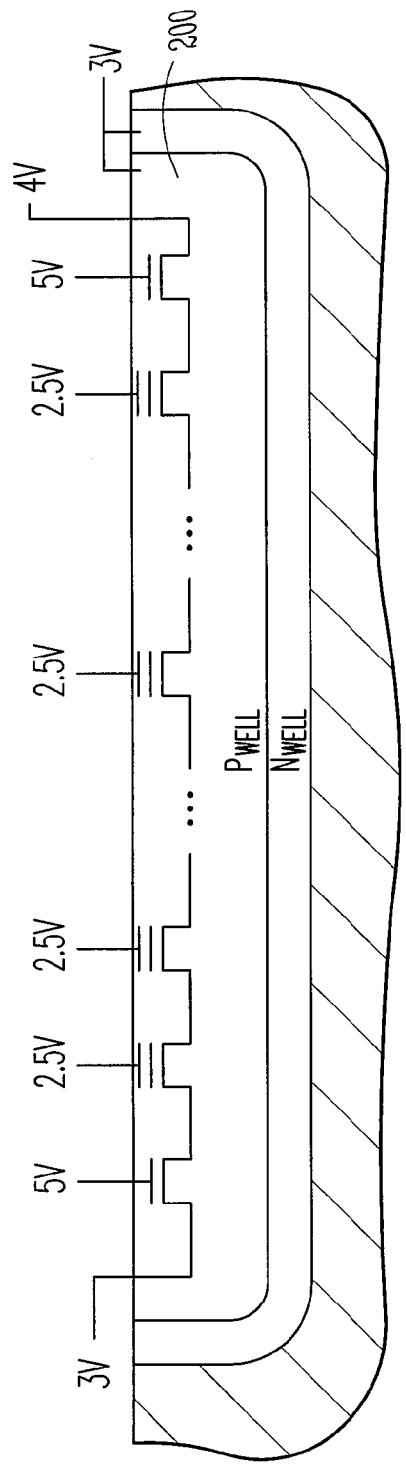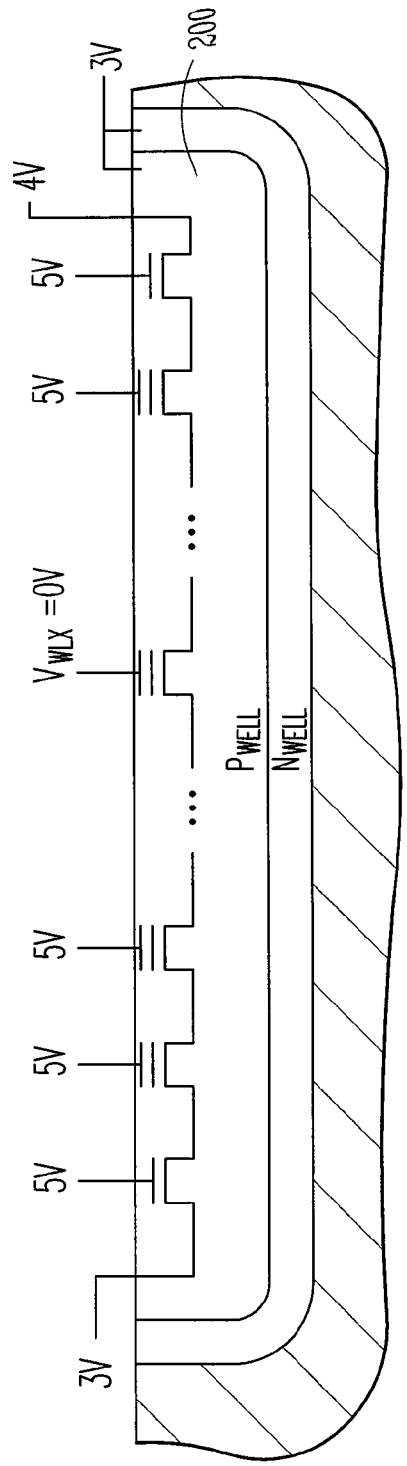

NON-VOLATILE MEMORY ERASE VERIFY

FIELD OF THE INVENTION

The present invention relates to non-volatile memory devices and, more particularly, to flash memory devices.

BACKGROUND

Flash memory is non-volatile, which means that it stores information on a semiconductor in a way that does not need power to maintain the information in the chip. Flash memory stores information in an array of transistors, called "cells," each of which stores one or more bits of information. Current flash memory devices are made in two forms: NOR flash and NAND flash. The names refer to the type of logic used in the storage cell array.

A flash cell is similar to a standard MOSFET transistor, except that it has two gates instead of just one. One gate is the control gate (CG) like in other MOS transistors, but the second is a floating gate (FG) that is insulated all around by an oxide layer. The FG is between the CG and the substrate. Because the FG is isolated by its insulating oxide layer, any electrons placed on it get trapped there and thus store the information.

BRIEF DESCRIPTION OF THE DRAWINGS

FIG. 2B is a partial schematic diagram of a NAND flash memory cell string of FIG. 1 illustrating a first verify operation;

FIG. 2C is a partial schematic diagram of a NAND flash memory cell string of FIG. 1 illustrating a second verify operation;

DESCRIPTION

In the following detailed description of the invention, reference is made to the accompanying drawings which form a part hereof, and in which is shown, by way of illustration, different embodiments in which the invention may be practiced. These embodiments are described in sufficient detail to enable those skilled in the art to practice the invention. Other embodiments may be utilized and structural, logical, and electrical changes may be made without departing from the scope of the present invention.

As recognized by those skilled in the art, memory devices of the type described herein are generally fabricated as an integrated circuit containing a variety of semiconductor devices. The integrated circuit is supported by a substrate. Integrated circuits are typically repeated multiple times on each substrate. The substrate is further processed to separate the integrated circuits into dice, as is well known in the art. The figures are provided to help facilitate an understanding of the detailed description, are not intended to be accurate in scale, and have been simplified. The term conductor as used herein is intended to include conductors and semi-conductors, including but not limited to metals, metal alloy, doped silicon and polysilicon.

The following detailed description is, therefore, not to be taken in a limiting sense, and the scope of the present invention is defined only by the appended claims, along with the full scope of equivalents to which such claims are entitled.

Figure 1:
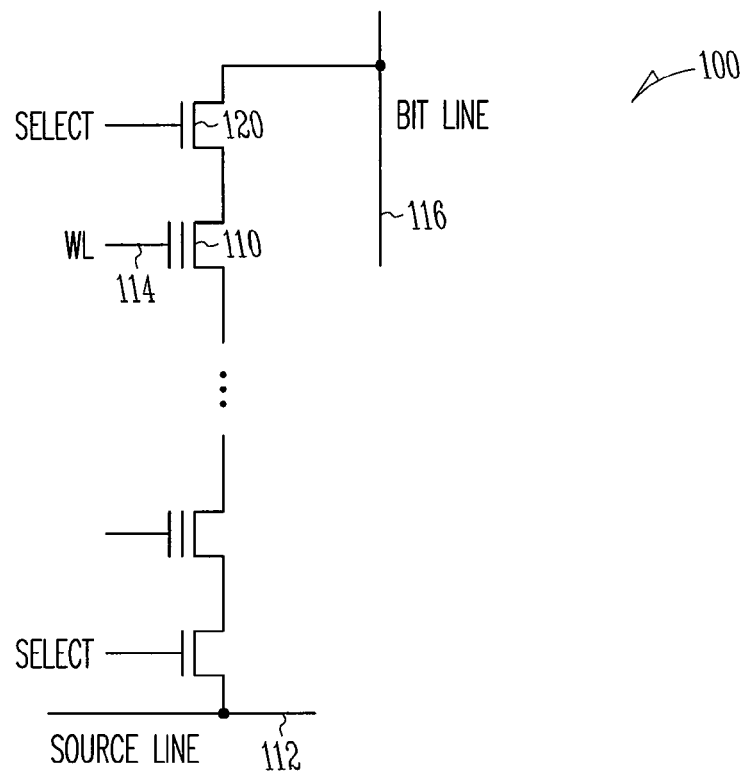
FIG. 1 illustrates a simplified portion of a NAND flash memory array of an embodiment of the invention.

FIG. 1 illustrates a simplified portion of a NAND flash memory array of an embodiment of the invention. NAND Flash uses tunnel injection for writing and tunnel release for erasing. The NAND memory includes floating gate memory cells 110 coupled to source line 112, word lines 114 and a bit line 116. The cells are coupled in series between the bit line and source line. One or more select transistors 120 are used to selective NAND strings. The NAND memory string 100 of FIG. 1 is fabricated in a semi-conductor well. A well structure, as known to those in the art, is a doped region of a substrate provided to isolate structures from the substrate. The well typically has a triple well profile with both P-type and N-type doping.

FIG. 2C is a schematic diagram of a NAND flash memory cell string illustrating a substrate well. The voltage nodes for the NAND string include a Vsgs gate node for the select transistor to source line, a Vsgd gate node for the select transistor to drain line, Vwl0 to Vwln for the word line nodes of flash transistors 0 to n, including a Vwlx for the word line node of a specific flash memory cell, and a Vwell node coupled to bias the semiconductor well. A bit line is biased to a voltage Vbl and a source line is biased to a voltage Vsrc.

Erasing flash memory cells includes an erase process to remove charge from the floating gate, a verify operation to determine if the floating gate is over-erased, and a soft program operation to add charge to the floating gate if an over-erase state is determined. It will be appreciated by those skilled in the art that the erase operation in flash memory devices can be iterative. That is, the erase and verify operations can be performed in alternating steps. Alternatively, the erase and soft program operations can be performed using voltage pulses to bias the cell nodes accordingly.

Figure 2A:
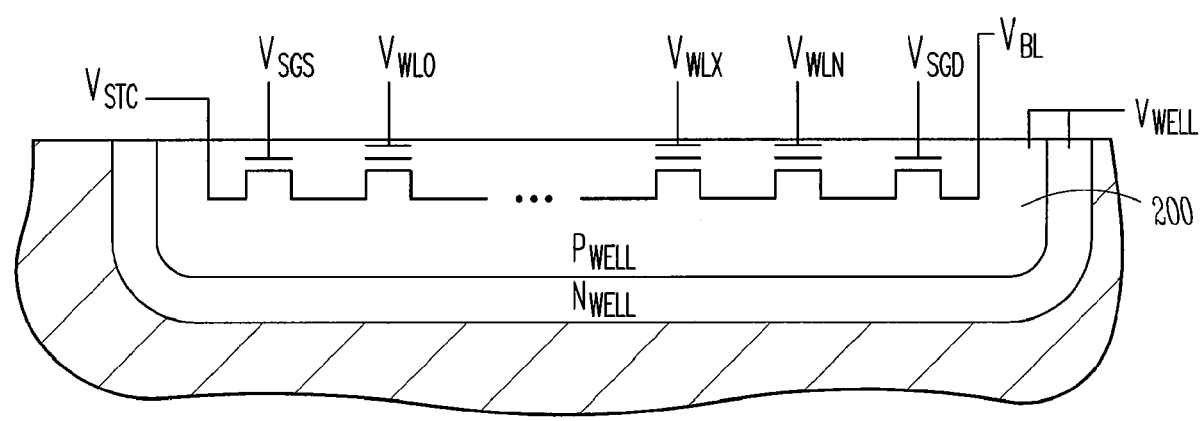
FIG. 2A is a partial schematic diagram of a NAND flash memory cell string of FIG. 1 illustrating a substrate well in cross-section.

An embodiment of erase verify operation is shown in FIG. 2B. A first erase verify includes biasing the well, including the Pwell portion and Nwell portion, to 3 volts. The source, i.e., Vstc in FIG. 2A, is charged to 3 volts. The bitline terminal, i.e., Vbl in FIG. 2A, is charged to 4 volts. The select gate node, i.e., Vsgs in FIG. 2A, is charged to 5 volts. The select gate node, i.e., Vsgd in FIG. 2A, is charged to 5 volts. The gates of each of Vwl0 to Vwln for the word line nodes are charged to 2.5 volts or half the select node voltages. This verify operation will verify that all Wls voltages are less than −0.5 volts.

An embodiment of erase verify operation is shown in FIG. 2C. A first erase verify includes biasing the well, including the Pwell portion and Nwell portion, to 3 volts. The source, i.e., Vstc in FIG. 2A, is charged to 3 volts. The bitline terminal, i.e., Vbl in FIG. 2A, is charged to 4 volts. The select gate node, i.e., Vsgs in FIG. 2A, is charged to 5 volts. The select gate node, i.e., Vsgd in FIG. 2A, is charged to 5 volts. The gate of one of the word line nodes, e.g., Wlx is held at zero volts. The gates of each the remaining of gates but not Wlx are charged to 5.0 volts. This verify operation will verify that the Vt of Wlx is greater than −3 volts.

In prior art flash memory devices, the memory cell well is discharged to zero volts following an erase operation. In embodiments of the present invention, the word line voltages and well voltage are controlled during erase verify operations to verify a negative voltage range of the floating gates or charge storage layers. In one embodiment, the memory cells are verified to have a charge storage layer (e.g., a floating gate) charged between −0.5 and −3.0 volts. Other voltage ranges can be verified and embodiments of the invention are not limited to a specific range.

Figure 2D:
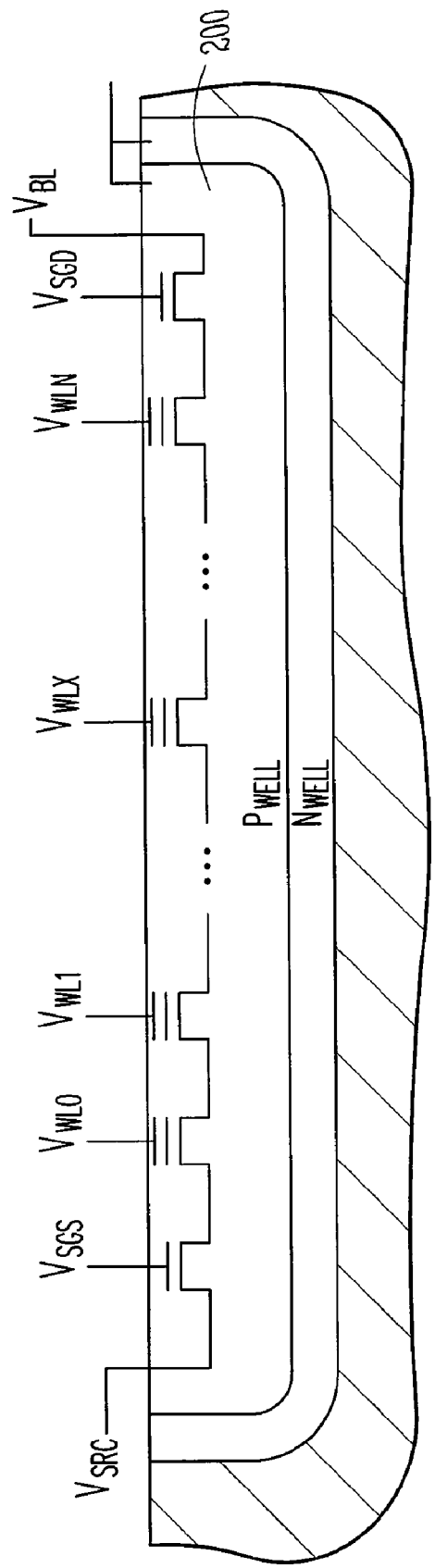
FIG. 2D is a partial schematic diagram of a NAND flash memory cell string verify operations.

FIG. 2D further shows the bias conditions for an erase verify operation. In one embodiment, referring again to FIG. 2, sample voltages for the NAND string during both verify operations is provided as:

$Vsgs = Vwell + \alpha$;
$Vsgd = Vwell + \alpha$;
$Vsrc = Vwell$; and
$Vbl = Vwell + \beta$, were $\alpha$ is about 2 to about 5 volts and $\beta$ is about one volt. During the first verify operation Vwl0 to $Vwln = Vwell - |Vverify1|$. During the second verify operation $Vwlx = 0$ volts (or $Vwell - |Vverify2|$), and Vwl0 to Vwln (excluding Vwlx) can be equal to Vwell, or $Vwell + \gamma$, where $\gamma$ is about 1 to 2 volts. In a 32 bit application, n equals 31. However, n may equal multiples of 2 in other embodiments.

Figure 3A:
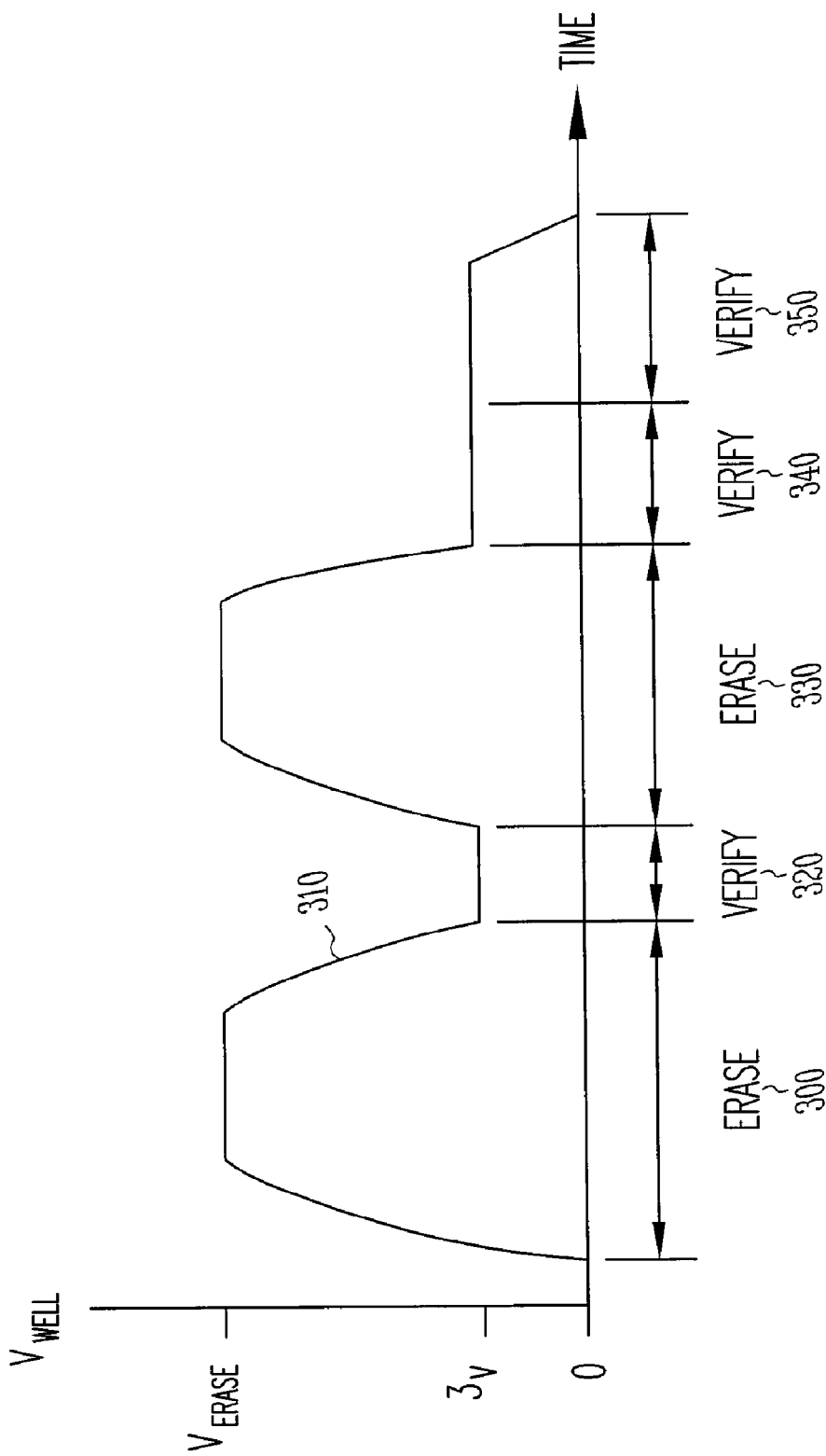
FIGS. 3A and 3B illustrate a voltage profiles of the Vwell node of a substrate well.
Figure 3B:
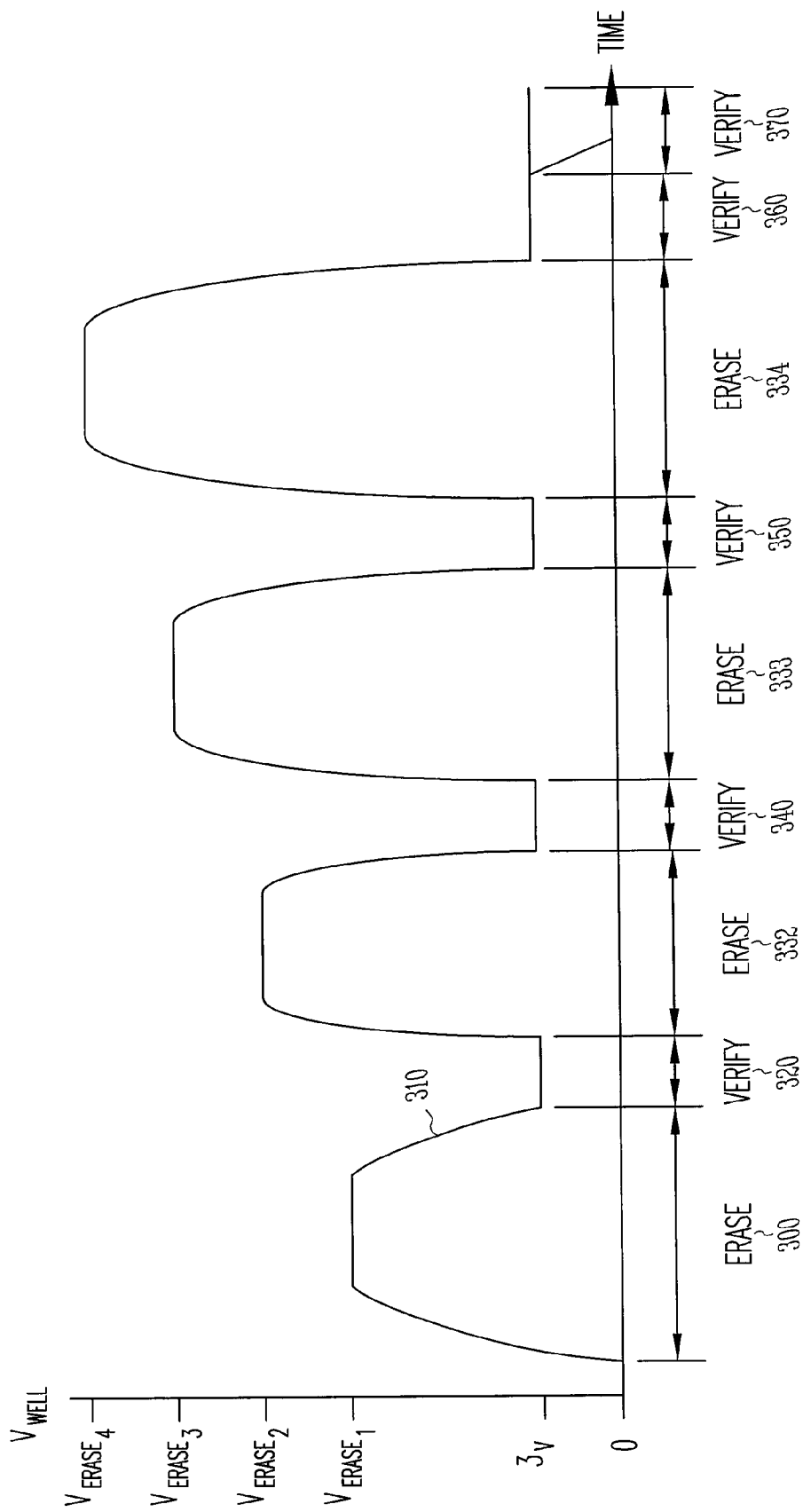

For explanative purposes, embodiments are described herein using the verify range of −0.5 and −3.0 volts. Referring to FIGS. 3A and 3B, voltage profiles of the Vwell node is explained for one embodiment. During an erase phase, the Vwell voltage is ramped to an erase voltage (Verase). In one embodiment Verase is about X volts, where X is greater than 3. In an embodiment, Verase is greater than 9 volts. In an embodiment, Verase is greater than 12 volts. In an embodiment, Verase is greater than 15 volts. Referring now to FIG. 3B, it is shown that the first erase pulse is ramped to $Verase_1$ and subsequent erase pulses, here shown as pulses two, three and four, however the Verase waveform it not so limited unless expressly claimed. The subsequent erase pulses 332, 333, and 334 are ramped to at least $Verase_2$, which is greater than $Verase_1$. Moreover, each subsequent erase pulse is ramped to a voltage greater than the previous erase pulse. As shown in FIG. 3B, an erase pulse 300 is applied to the well. Thereafter, a verify 320 is performed. If the charge storage layer was not erased a further erase pulse 332 is applied to the well. Erase pulse 332 has a voltage at least equal to and in an embodiment greater than erase pulse 300. Thereafter, a verify 340 is performed. If the charge storage layer was not erased a further erase pulse 333 is applied to the well. Erase pulse 333 has a voltage at least equal to and in an embodiment greater than erase pulse 332. Thereafter, a verify 350 is performed. If the charge storage layer was not erased a further erase pulse 334 is applied to the well. Erase pulse 334 has a voltage at least equal to and in an embodiment greater than erase pulse 333. Thereafter, a verify 360 is performed. A further final verify 370 may be performed.

In prior art memory devices, the Vwell voltage is discharged to zero volts following an erase operation to perform a verify operation. In embodiments of the present invention, the Vwell is discharged to positive voltage level, such as three volts. With the Vwell at three volts, the word line voltages Vwl0 to Vwln are charged to 2.5 volts. By activating the select transistors using Vsgs and Vsgd, the memory cells can be verified to have a floating gate charge such that the memory cells have a threshold voltage, Vt, of less than −0.5 volts.

If the memory cells are not erased to the level where all memory cells have a Vt of less than −0.5 volts, a second optional erase operation is performed on the cells. That is, the Vwell voltage is charged to Verase as illustrated in FIG. 3 and the appropriate voltages coupled to the memory cell nodes.

After the second erase operation is performed, if needed, such that the Vt of all the memory cells is less than −0.5 volts, the Vwell is discharged to the positive bias voltage. A first verify is performed after all of the memory cells have a Vt of less than −0.5 volts. It will be appreciated that numerous erase and first verify operations may need to be performed to erase the memory cells to a desired level.

Once the memory cells have been verified to have a Vt of less than −0.5 volts, the second verify operation is performed. This verify operation determines if any memory cell has been erased to a level where the cell Vt is less than a desired lower limit. For example, a Vt in the range of −0.5 to −3.0 volts may be desired in a memory device embodiment. As such, the Vwell is biased to 3 volts while the word lines are also biased to 5 volts. A target word line voltage Vwlx for a specific one of the word lines is biased to zero volts. In one embodiment, each of the word lines is sequentially biased to zero volts while the remaining word lines are at 5 volts. This bias technique verifies that the selected memory cell associated with the selected word line has a Vt of no less than −3.0 volts. That is, there will be no current conducted in the bit line (drain to source line) if the selected memory cell has a Vt in the −0.5 to −3.0 volt range. If one or more memory cells have a Vt of less than −3.0 volts, a soft program operation can be performed on either all memory cells in the string or limited to the failed memory cells only. Subsequent verify operation can be performed following the soft program operation(s).

Figure 4:
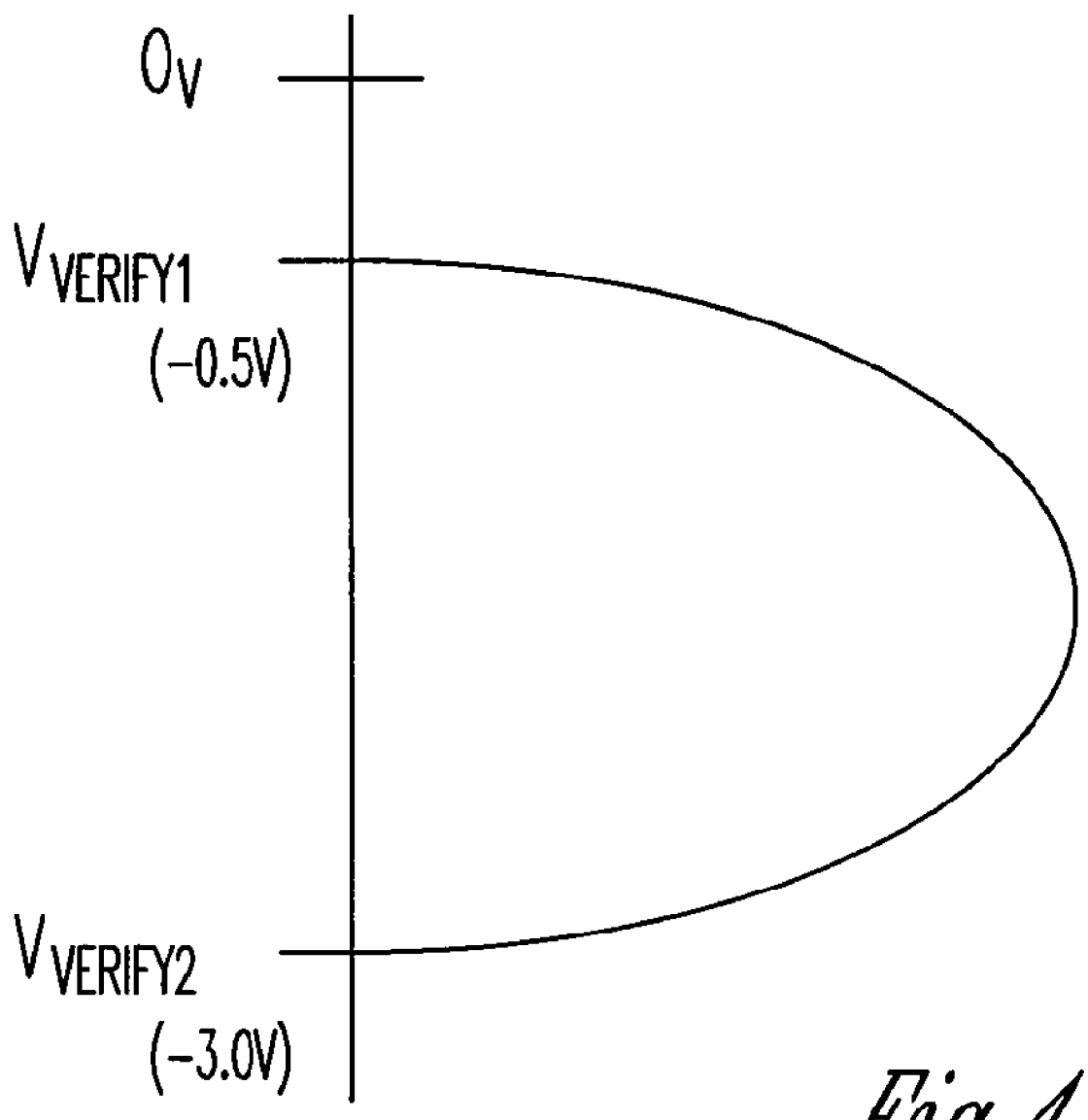
FIG. 4 illustrates a Vt distribution within a predefined negative range.

The processes described above allow the Vt distribution of flash memory cells to be limited within a predefined negative range as illustrated in FIG. 4. In one embodiment, this range is −0.5 to −3.0 volts, but the present invention is not limited to this range.

Figure 5:
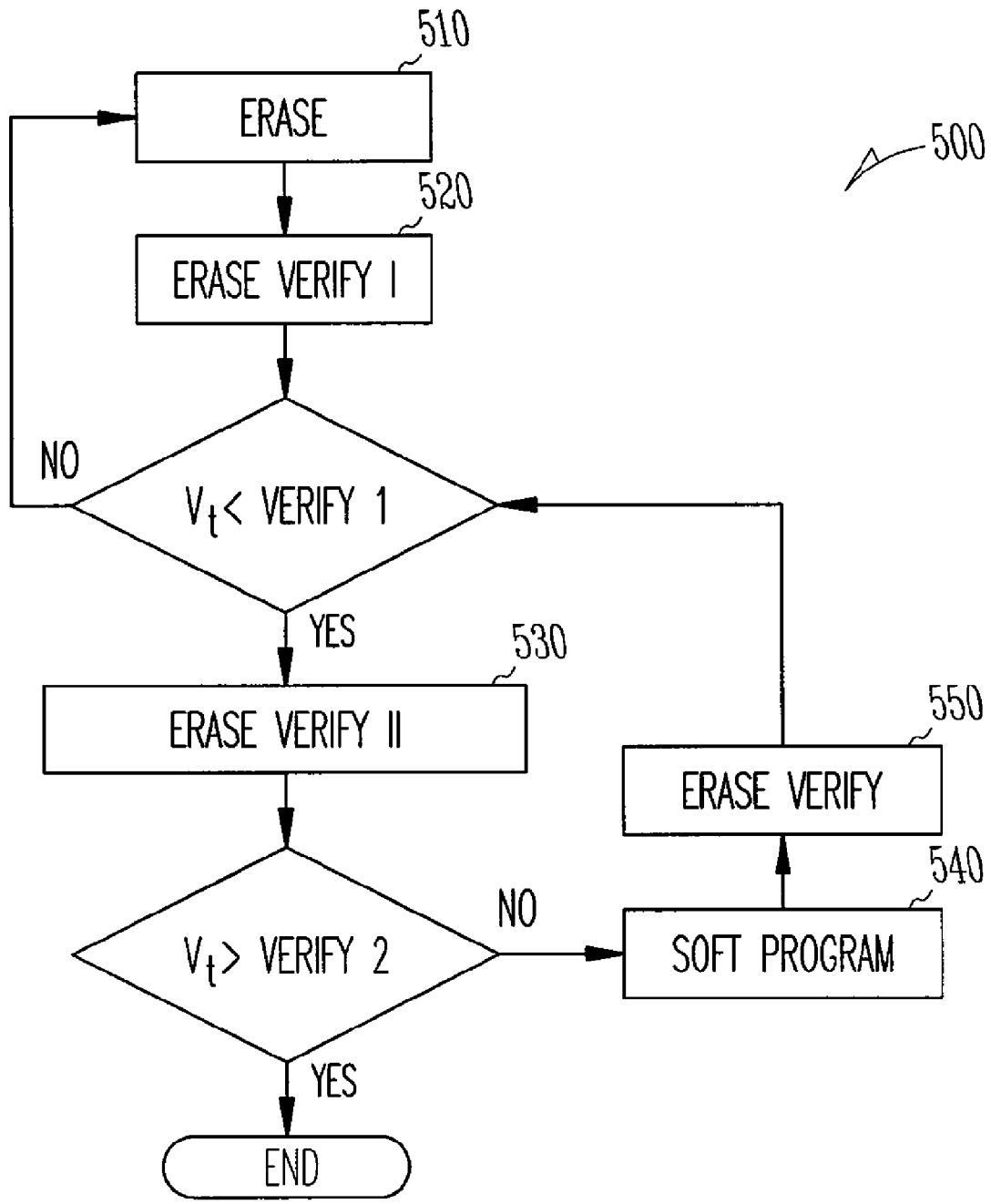
FIG. 5 is a flow-chart illustrating erase verify operations according to embodiments.

Referring to FIG. 5, a flow chart of one embodiment 500 is described. An erase process 510 is first performed on a memory cell. The erase process can be performed on any number of memory cells, including a single cell, column or erase page of the memory. After the erase operation is completed, the well voltage is discharged to a positive voltage and a first verify operation 520 is performed on the erased memory cell(s) to verify that the erased cell has a threshold voltage below a predefined zero or negative voltage level, Vverify1. The Vverify1 voltage level is the upper voltage of a desired Vt distribution range. If the memory cell(s) do not have a threshold voltage below Vverify1 operations 510 and 520 are repeated.

A second verify operation 530 is performed on each erased memory cell to determine if the erased cell(s) have a threshold voltage above a lower negative voltage limit, Vverify2. The Vverify2 voltage level is the lower voltage of a desired Vt distribution range. If the memory cell(s) do not have a threshold voltage above Vverify2, a soft write operation 540 is performed on the memory cell(s). As explained above, the soft program operation can be limited to a single memory cell or be executed on multiple cells.

After the soft program operation, the memory cells can be optionally verified at operation 550. This optional verify operation is performed with a Vwell bias at zero volts. As such, the verification operation 550 is performed to determine if the memory cell(s) have a negative threshold voltage. The memory cell(s) are then verified at operation 530 to determine if the cells are in the Vt distribution range. The Vwell level may need to be charged following the soft program operation to verify the Vt is in the desired range.

By controlling the well discharge following an erase operation, embodiments of the present invention allow the erase verify operation to be performed without a separate well bias operation. That is, by controlling the discharge level, the well voltage can remain charged for verification. This provides a faster and more simple verify operation than verifying with a fully discharged well.

Figure 6:
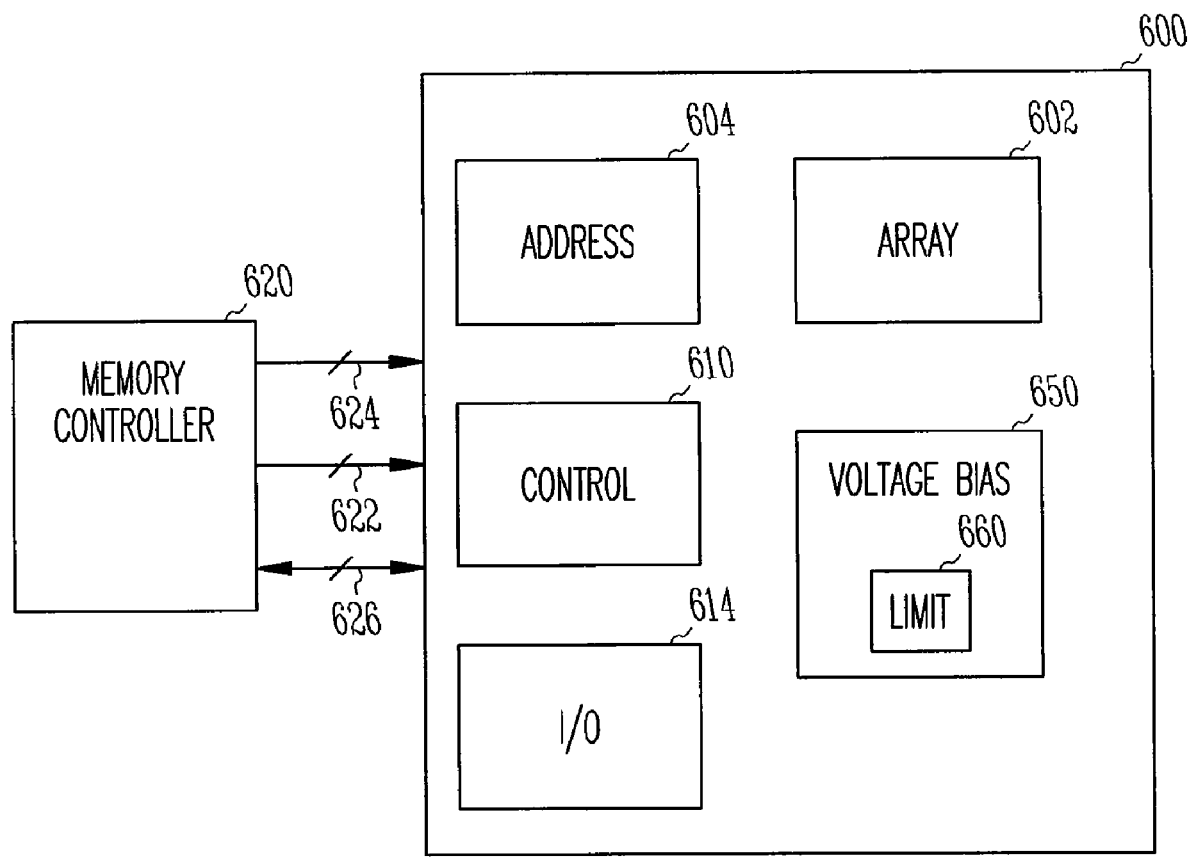
FIG. 6 is a block diagram of a memory device of an embodiment of the invention.

FIG. 6 is a simplified block diagram of an integrated circuit memory device 600 in accordance with an embodiment of the invention. The memory device 600 includes an array of non-volatile floating gate memory cells 602, address circuitry 604, control circuitry 610, and Input/Output (I/O) circuitry 614.

The memory device 600 can be coupled to a processor 620 or other memory controller for accessing the memory array 602. The memory device 600 coupled to a processor 620 forms part of an electronic system. Some examples of electronic systems include personal computers, peripheral devices, wireless devices, digital cameras, personal digital assistants (PDA's) and audio recorders.

The memory device 600 receives control signals across control lines 622 from the processor 620 to control access to the memory array 602 via control circuitry 610. Access to the memory array 602 is directed to one or more target memory cells in response to address signals received across address lines 624. Once the array is accessed in response to the control signals and the address signals, data can be written to or read from the memory cells across data, DQ, lines 626. A voltage bias circuit 650 is provided to bias the voltages described above for verifying the memory cells. The bias circuitry can include a discharge limiting circuit 660 which limits the Vwell discharge following an erase operation, as described above.

In addition to general memory functions, control circuit 610 performs a verify operation on the memory cells as described above. It will be appreciated by those skilled in the art that additional circuitry and control signals can be provided, and that the memory device of FIG. 6 has been simplified to help focus on the invention. It will be understood that the above description of a memory device is intended to provide a general understanding of the memory device and is not a complete description of all the elements and features of a typical memory device.

Although embodiments have been described with reference to specific example embodiments, it will be evident that various modifications and changes may be made to these embodiments without departing from the broader spirit and scope of the invention. Accordingly, the specification and drawings are to be regarded in an illustrative rather than a restrictive sense.

The invention claimed is:

1. A flash memory device comprising:
a memory cell having a semiconductor well; and
circuitry configured to bias the semiconductor well to a first positive voltage level during an erase operation on the memory cell and to bias the semiconductor well to a second positive voltage level during an erase verification operation on the memory cell.

2. The flash memory device of claim 1, wherein the circuitry is configured to perform the erase verification operation to confirm that a threshold voltage of the memory cell is within a specific negative voltage range.

3. The flash memory device of claim 1, wherein the circuitry is configured to bias the semiconductor well to a first Verase voltage during a first erase operation and to bias the semiconductor well to a second Verase voltage during a second erase operation, wherein the second Verase voltage is greater than the first Verase voltage.

4. The flash memory device of claim 1, wherein the memory cell comprises a charge storage node.

5. The flash memory device of claim 1, wherein the circuitry is configured to perform the erase operation and the erase verification operation iteratively.

6. The flash memory device of claim 2, wherein the second positive voltage level is Vwell and the specified negative voltage range has a lower value of −Vwell.

7. The flash memory device of claim 2, wherein the erase verification operation is performed in first and second operations.

8. The flash memory device of claim 2, wherein the circuitry is configured to perform a soft program operation on the memory cell if the threshold voltage of the memory cell is less than the lower limit of the specified negative voltage range.

9. The flash memory device of claim 7, wherein the first operation verifies that the threshold voltage of the memory cell is less than the upper limit of the specified negative voltage range.

10. The flash memory device of claim 7, wherein the second operation verifies that the threshold voltage of the memory cell is greater than the lower limit of the specified negative voltage range.

11. The flash memory device of claim 7, wherein the circuitry is configured to perform the second operation only if the first operation verifies erasure of the memory cell.

12. The flash memory device of claim 3, wherein the circuitry is configured to bias the semiconductor well to a subsequent Verase voltage during at least one additional a further erase operation after the second erase operation, and wherein the subsequent Verase voltage is greater than the second Verase voltage.

13. The flash memory device of claim 4, wherein the charge storage node comprises a floating gate of a transistor.

14. A flash memory device comprising:
a plurality of memory cell cells fabricated in having a substrate semiconductor well; and
circuitry configured to bias the semiconductor well to a first positive voltage level during an erase operation on the memory cell, wherein the circuitry is configured to:
control a discharge level of the semiconductor well during an erase verification operation following the erase operation to prevent the semiconductor well from fully discharging lower than a second positive voltage level; and perform the erase verification operation to confirm that a threshold voltage of the memory cell is within a particular voltage range, Vverify1 to Vverify2.

15. The flash memory device of claim 14, wherein the second positive voltage level is the absolute value of Vverify2.

16. The flash memory device of claim 14, wherein Vverify1 and Vverify2 are about −0.5 volts and −3.0 volts, respectively.

17. The flash memory device of claim 14, wherein the memory cell comprises a charge storage node.

18. The flash memory device of claim 17, wherein the charge storage node comprises a floating gate of a transistor.

19. A method of verifying an erase operation in a non-volatile memory device, the method comprising:
biasing a semiconductor well to a first positive voltage, Verase, during an erase operation on a memory cell fabricated in the semiconductor well; and
biasing the semiconductor well to a lower, second positive voltage, Vwell during an erase verification operation that follows the erase operation to verify whether the memory cell has a threshold voltage Vt within a particular voltage range, Vverify1 to Vverify2.

20. The method of claim 19, wherein the erase verification operation comprises a first operation to verify whether the threshold voltage Vt of the memory cell is less than Vverify1 and a second operation to verify whether the threshold voltage Vt of the memory cell is greater than Vverify2.

21. The method of claim 19, further comprising performing a soft program operation on the memory cell if the threshold voltage Vt is less than the lower limit of the particular voltage range, Vverify1 to Vverify2.

22. The method of claim 19, wherein the erase operation and the erase verification operation are performed iteratively.

23. The method of claim 20, wherein Vverify1 and Vverify2 are about −0.5 volts and −3.0 volts, respectively.

24. The method of claim 20, wherein the memory cell is one of a plurality of memory cells sharing the semiconductor well and wherein the first operation verifies whether a corresponding threshold voltage Vts of all of the memory cells are less than Vverify1 at substantially the same time.

25. The method of claim 20, wherein the second operation is performed only if the first operation verifies erasure of the memory cell.

26. The method of claim 23, wherein Vwell is about 3.0 volts.

27. The method of claim 24, wherein the second operation individually verifies whether a corresponding threshold voltage Vt of each one of the memory cells is greater than Vverify2.

28. A method of verifying an erase operation in a NAND flash memory device, the method comprising:

biasing a semiconductor well to a first positive voltage, Verase, during an erase operation on a NAND string of memory cells fabricated in the semiconductor well; and biasing the semiconductor well to a lower, second positive voltage, Vwell, during a two-process erase verification operation is configured to verify that each of the memory cells of the NAND string has a respective threshold voltage Vt within a particular negative voltage range, Vverify1 to Vverify2, wherein a first verification operation of the two-process erase verification operation verifies whether corresponding threshold voltage Vts of all of the memory cells are less than Vverify1, and a second verification operation of the two-process erase verification operation individually verifies whether a corresponding threshold voltage Vt of each one of the memory cells is greater than Vverify2.

29. The method of claim 28, wherein the memory cells are each coupled to a word line voltage, Vwl, such that Vwl−Vwell is equal to Vverify1.

30. The method of claim 28, wherein during the second verification operation, each of the memory cells is sequentially coupled to Vwell minus the absolute value of Vverify2 while remaining ones of the memory cells are each coupled to Vwell.

31. The method of claim 28, wherein the particular negative voltage range is about −0.5 to −3.0 volts.

32. The method of claim 28, further comprising biasing the semiconductor well to a third positive voltage that is greater than the first positive voltage when the erase is not verified.

33. The method of claim 29, wherein Vwl is about 2.5 volts, Vwell is about 3 volts and Vverify1 is about −0.5 volts.

34. The method of claim 30, wherein Vverify2 is about −3.0 volts.

* * * * *

UNITED STATES PATENT AND TRADEMARK OFFICE
CERTIFICATE OF CORRECTION

PATENT NO.       : 7,768,835 B2                                                 Page 1 of 1
APPLICATION NO.  : 11/502317
DATED            : August 3, 2010
INVENTOR(S)      : Akira Goda It is certified that error appears in the above-identified patent and that said Letters Patent is hereby corrected as shown below:

In column 5, line 59, in Claim 2, delete "specific" and insert -- specified --, therefor.

In column 6, line 28, in Claim 12, after "during" delete "at least one additional".

In column 6, line 35, in Claim 14, after "a" delete "plurality of".

In column 6, line 35, in Claim 14, after "cell" delete "cells fabricated in".

In column 6, line 36, in Claim 14, before "semiconductor" delete "substrate".

In column 6, line 43, in Claim 14, before "discharging" delete "fully".

In column 6, line 64, in Claim 19, after "Vwell" insert -- , --.

In column 8, line 3, in Claim 28, after "operation" insert -- that follows the erase operation, wherein the two-process erase verification operation --.

Signed and Sealed this

Twenty-sixth Day of October, 2010

David J. Kappos
*Director of the United States Patent and Trademark Office*